US009422748B2

(12) United States Patent
Liu

(10) Patent No.: US 9,422,748 B2
(45) Date of Patent: Aug. 23, 2016

(54) LOCK AND THE APPLICATION THEREOF

(71) Applicant: Celestica Technology Consultancy (Shanghai) Co., Ltd., Shanghai (CN)

(72) Inventor: Chi-Ming Liu, Zhongli (TW)

(73) Assignee: CELESTICA TECHNOLOGY CONSULTANCY (SHANGHAI) CO., LTD., Shanghai (CN)

( * ) Notice: Subject to any disclaimer, the term of this patent is extended or adjusted under 35 U.S.C. 154(b) by 386 days.

(21) Appl. No.: 13/875,857

(22) Filed: May 2, 2013

(65) Prior Publication Data

US 2013/0291605 A1 Nov. 7, 2013

(30) Foreign Application Priority Data

May 2, 2012 (TW) ............................ 101208199 U

(51) Int. Cl.

| | |
|---|---|
| ***E05C 5/04*** | (2006.01) |
| ***E05B 65/00*** | (2006.01) |
| ***E05B 63/00*** | (2006.01) |
| ***E05C 19/06*** | (2006.01) |
| *B65D 45/32* | (2006.01) |
| *H05K 5/00* | (2006.01) |
| *H05K 7/00* | (2006.01) |
| *G06F 1/16* | (2006.01) |

(52) U.S. Cl.

CPC ............. *E05B 65/00* (2013.01); *E05B 63/006* (2013.01); *E05B 65/006* (2013.01); *E05C 19/06* (2013.01); *Y10T 70/50* (2015.04)

(58) Field of Classification Search

CPC ...... E05B 65/00; E05B 63/006; E05C 19/06; Y10T 70/50; Y10T 292/1099; Y10T 24/4578

USPC ......... 292/1, 159, 140, 256.71, 256.73, 257, 292/145, 327, DIG. 35, DIG. 47, 251; 361/679.57, 679.58, 679.01; 74/56

See application file for complete search history.

(56) References Cited

U.S. PATENT DOCUMENTS

| | | | | | |
|---|---|---|---|---|---|
| 368,595 | A * | 8/1887 | King | E05B 65/0042 | 292/332 |
| 580,963 | A * | 4/1897 | Taylor | E05B 63/0017 | 292/140 |
| 1,411,581 | A * | 4/1922 | Ottinger | E05B 3/10 | 292/336.5 |
| 1,619,501 | A * | 3/1927 | Evans | B60J 1/2011 | 160/105 |
| 2,635,908 | A * | 4/1953 | Zuber | E05C 3/042 | 292/194 |
| 2,650,124 | A * | 8/1953 | Olson | E05C 3/041 | 292/194 |
| 2,732,236 | A * | 1/1956 | Bretthauer | G03B 17/56 | 292/140 |
| 3,262,227 | A * | 7/1966 | Pentecost | A62B 13/00 | 16/231 |
| 3,550,412 | A * | 12/1970 | Silverman | E05C 5/04 | 292/251 |
| 3,858,917 | A * | 1/1975 | Nahon | E05C 19/18 | 292/251 |

(Continued)

*Primary Examiner* — Kristina Fulton
*Assistant Examiner* — Faria Ahmad
(74) *Attorney, Agent, or Firm* — Novick, Kim & Lee, PLLC; Jae Youn Kim

(57) ABSTRACT

The present invention discloses a lock and the application thereof. The lock is applied on a base having an inner surface and an outer surface. The lock comprises a locking plate and a motion module. The motion module has a curved surface facing the locking plate. The curved surface has a first surface and a second surface. A main feature of the present invention is that the lock has a close status and a far status. The locking plate contacts with the first surface and has a first distance from the base in the close status, and contacts with the second surface of the base and has a second distance, which is greater than the first distance, from the base in the far status. The invention has the advantages of low cost and simplicity, and solves the long lasting problem of the prior arts.

18 Claims, 4 Drawing Sheets

(56) References Cited

U.S. PATENT DOCUMENTS 3,930,678 A * 1/1976 Alexander .......... E05B 65/0894 292/288
4,099,754 A * 7/1978 Hoebing ................... E05C 5/04 292/206
4,102,545 A * 7/1978 Jay ...................... E05B 65/0864 292/147
4,486,918 A * 12/1984 Peebles .................... G05G 1/10 16/422
4,596,504 A * 6/1986 Gunther .................... F16B 5/10 24/581.1
4,801,164 A * 1/1989 Mosch .................... E05C 3/046 292/204
4,805,946 A * 2/1989 Erwin ................... F16B 41/005 292/251
4,940,355 A * 7/1990 Buchanan .............. A47B 47/05 24/663
5,110,165 A * 5/1992 Piltingsrud ............. E05C 3/046 292/242
5,161,839 A * 11/1992 Piltingsrud ............. E05C 3/046 292/241
5,544,714 A * 8/1996 May ....................... B60K 11/04 165/67
5,741,032 A * 4/1998 Chaput ............... E05B 65/0811 292/202
5,839,767 A * 11/1998 Piltingsrud ......... E05B 17/2003 292/158
6,068,306 A * 5/2000 Brautigam .............. E05C 3/046 292/242
6,349,576 B2 * 2/2002 Subliskey ..................... 292/204
6,354,639 B1 * 3/2002 Minter .................... E05C 9/021 292/142
6,425,611 B1 * 7/2002 Minter ..................... G05B 7/00 292/336.3
6,443,505 B1 * 9/2002 Linares ................... E05B 17/04 292/1
6,565,133 B1 * 5/2003 Timothy ............. E05B 65/0841 292/242
7,665,775 B1 * 2/2010 Miller ................. E05B 65/0841 292/240
8,118,334 B2 * 2/2012 Ramsauer ............... E05C 3/042 292/194
8,876,175 B2 * 11/2014 Lopes ................. E05B 15/0053 292/202
8,967,684 B2 * 3/2015 Phelps ................ E05B 15/0006 292/240
9,069,529 B2 * 6/2015 Lee ......................... G06F 1/166
2003/0020286 A1 * 1/2003 McHenry ............ E05B 17/2019 292/336.3
2007/0175246 A1 * 8/2007 Hsai ....................... B60D 1/065 70/57
2008/0302143 A1 * 12/2008 Clark .................. E05B 65/0089 70/57
2009/0320534 A1 * 12/2009 Lee ......................... E05B 63/24 70/158
2010/0026017 A1 * 2/2010 Ramos, III ............ E05C 19/182 292/295
2011/0309639 A1 * 12/2011 Chen ..................... E05B 65/001 292/140
2012/0287595 A1 * 11/2012 Liang .................... G06F 1/1616 361/810
2014/0118901 A1 * 5/2014 Lee ......................... G06F 1/166 361/679.01
2014/0153164 A1 * 6/2014 Liang ................... H05K 5/0221 361/679.01
2014/0211383 A1 * 7/2014 Qin ...................... H01Q 1/1214 361/679.01

* cited by examiner

LOCK AND THE APPLICATION THEREOF

This application claims priority to Taiwan Patent Application No. 101208199 filed on May 2, 2012.

BACKGROUND OF THE INVENTION

The present invention generally relates to a lock and the application thereof and, more particularly, to a lock capable of converting a horizontal axial rotation into a vertical displacement and the application thereof.

Electronic apparatus and storage devices in market are provided with a lock on the housing thereof to prevent access of components resided in the housing from people without authorization for security purpose. However, such lock currently available in market has disadvantages such as a large number of movable elements, a complex structure and a high cost.

It may therefore be desirable by one skilled in the art to provide a lock that allows a user to easily lock and unlock an object such as a cover plate of a housing with a simple, compact structure and low cost of.

BRIEF SUMMARY OF THE INVENTION

To achieve the aforesaid objective, examples of the present invention may provide a lock mounted to a base. The base has an inner surface and an outer surface. The lock comprises a lock plate and a motion module. The motion module has a curved surface facing the lock plate. The curved surface comprises a first surface and a second surface. A main feature of the present invention is that the lock has a close status and a far status. The lock plate abuts against the first surface and has a first distance from the base when the lock is in the close status, and abuts against the second surface and has a second distance, which is greater than the first distance, from the base when the lock is in the far status.

For example, the lock disclosed above comprises a fixed portion, a movable portion and an abutting portion in practical applications. The fixed portion is fixed to the inner surface of the base. The movable portion extends outwards from the fixed portion and can be elastically deformed under the action of an external force. The through-hole portion is formed in the movable portion and through the lock plate, and has a sidewall. The abutting portion extends in a normal direction from the sidewall and abuts against the curved surface of the lock to adjust a relative distance between the lock plate and the base. Furthermore, the fixed portion, the movable portion, the through-hole portion and the abutting portion are all selectively formed integrally with the lock plate (ONE PIECE FORMED).

The motion module further has an extending portion that extends vertically towards the base and extends through the through-hole portion to be pivotally connected with the through-hole portion. The base comprises a through-hole, and the motion module comprises an interfacing part having a head portion and a tail portion. The tail portion is fixed to an end of the extending portion and penetrates through the base to be pivotally connected with the base, and the head portion abuts against the outer surface of the base. Both the head portion and the extending portion have a cross-sectional area greater than that of the tail portion. Meanwhile, the motion module has two blocking surfaces, and the two blocking surfaces are disposed on the first surface and the second surface respectively and extend in a normal direction from the first surface and the second surface respectively to limit a rotation angle of the abutting portion.

Besides, an angle of smaller than 6° is included between the base and an extending direction of the movable portion of the lock plate. The motion module has a back surface facing away from the lock plate, and a vertical distance between the back surface and the base in the close status is the same as that in the far status. It is worth noting that, the lock of the present invention can be used in an electronic device or a computer housing.

According to the above descriptions, some examples of the present invention may provide a novel lock that allows the user to easily lock and unlock an object such as a cover plate of a housing effectively in a limited space. As compared to the prior art, the lock of the present invention has a simple structure, a low manufacturing cost and a small volume. Thereby, the long-lasting problem with the prior art is solved.

Some examples of the present invention may provide a lock applied to a base of an electronic device, the base has an inner surface and an outer surface, the lock comprises a lock plate comprising: a fixed portion; and a movable portion; and a motion module having a curved surface facing the lock plate, the curved surface comprising a first surface and a second surface.

Some examples of the present invention may provide a lock applied to a base of a computer housing, the base having an inner surface and an outer surface, the lock comprises a lock plate comprising: a fixed portion fixed to the inner surface of the base; a movable portion extending outwards from the fixed portion; a through-hole portion formed in the movable portion and through the lock plate, and the through-hole portion having a sidewall; and an abutting portion extending in an normal direction from the sidewall and abutting against the curved surface of the lock to adjust a relative distance between the lock plate and the base; and a motion module having a curved surface facing the lock plate, the curved surface comprising a first surface and a second surface, the motion module comprising: an extending portion extending vertically towards the base and extending through the through-hole portion; an interfacing part having a head portion and a tail portion, the tail portion is fixed to an end of the extending portion and penetrates through the base to be pivotally connected with the base, and the head portion abuts against the outer surface of the base, wherein both the head portion and the extending portion have a cross-sectional area greater than that of the tail portion; two blocking surfaces disposed on the first surface and the second surface respectively and extending in a normal direction from the first surface and the second surface respectively to limit a rotation angle of the abutting portion; and a back surface facing away from the lock plate.

Additional features and advantages of the present invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The foregoing summary, as well as the following detailed description of the invention, will be better understood when read in conjunction with the appended drawings. For the purpose of illustrating the invention, there are shown in the drawings examples which are presently preferred. It should be understood, however, that the invention is not limited to the precise arrangements and instrumentalities shown.

In the drawings.

DETAILED DESCRIPTION OF THE INVENTION

Figure 1A:
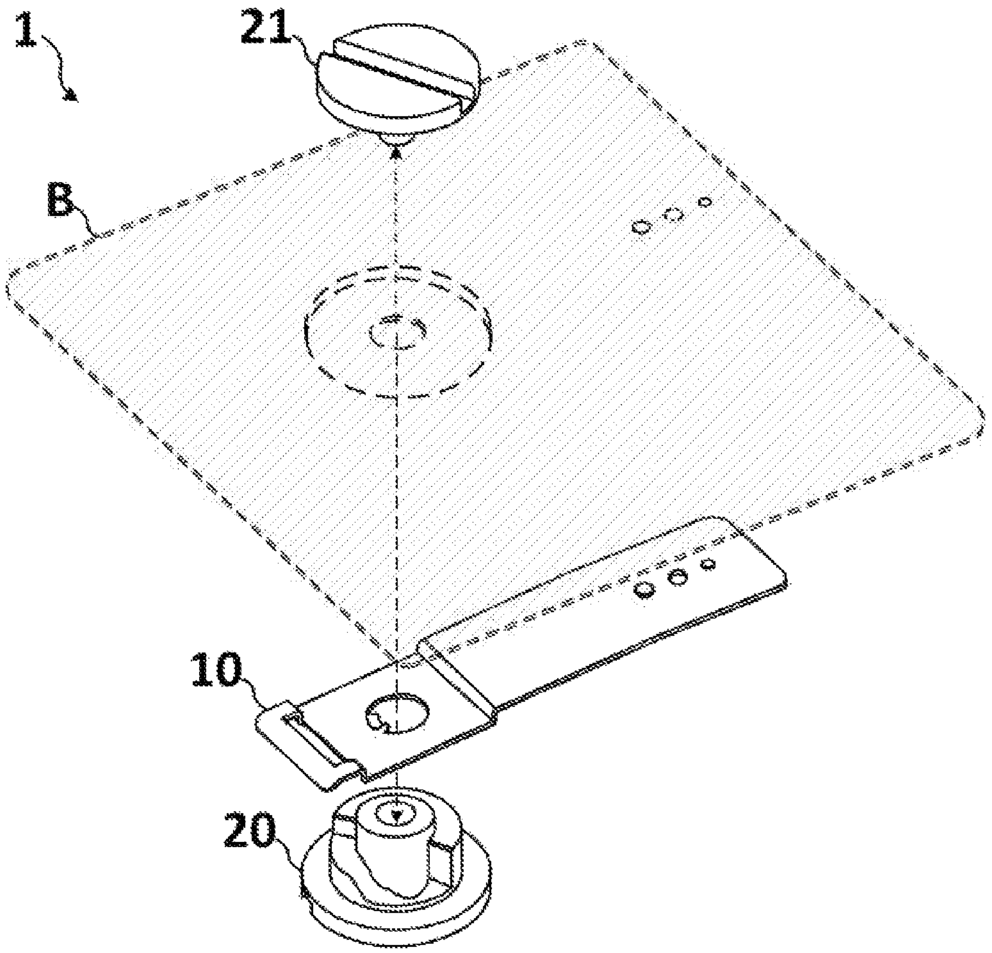
FIG. 1A is an assembly diagram of elements of a lock in accordance with an embodiment of the present invention.

Reference will now be made in detail to the present examples of the invention, examples of which are illustrated in the accompanying drawings. Wherever possible, the same reference numbers will be used throughout the drawings to refer to the same or like parts.

Hereinbelow, the aforesaid subject matter will be further described. The present invention relates to a lock that allows for locking and unlocking in a limited space. However, it shall be appreciated that, unless otherwise defined, all scientific and technical terms used in this specification shall have the same meanings as generally known by those skilled in the art. Additionally, what described in this specification is only some of various embodiments of the present invention, and any methods or devices similar to or equivalent to what described herein may be used in practical implementations of the present invention.

The wording "above or below" a numeric value as set forth herein shall be interpreted to include the numeric value itself. It shall be appreciated that, the wording "the present invention" and similar wordings used in this specification are all intended to mean the lock of the present invention. Furthermore, the sequence of steps of methods or flow processes used to execute disclosed functions in this specification shall not be limited to what described in this specification, but may be adjusted freely depending on the user's needs unless otherwise specified. Moreover, unless otherwise specified, the scale, sizes, relative positions and shapes of individual elements shown in the figures are all similar to what shall be in practical applications and this shall also be a basis for subsequent supplement or amendment of the specification. Considering that elements described in different embodiments of this specification have similar properties, like designations and reference numerals represent like elements throughout the attached drawings. Further, it shall be noted that, structural parts such as devices, modules and units set forth in this specification shall not be limited to hardware implementations independent of each other, but may also be integrated into a single unit.

Figures 1B, 1C:
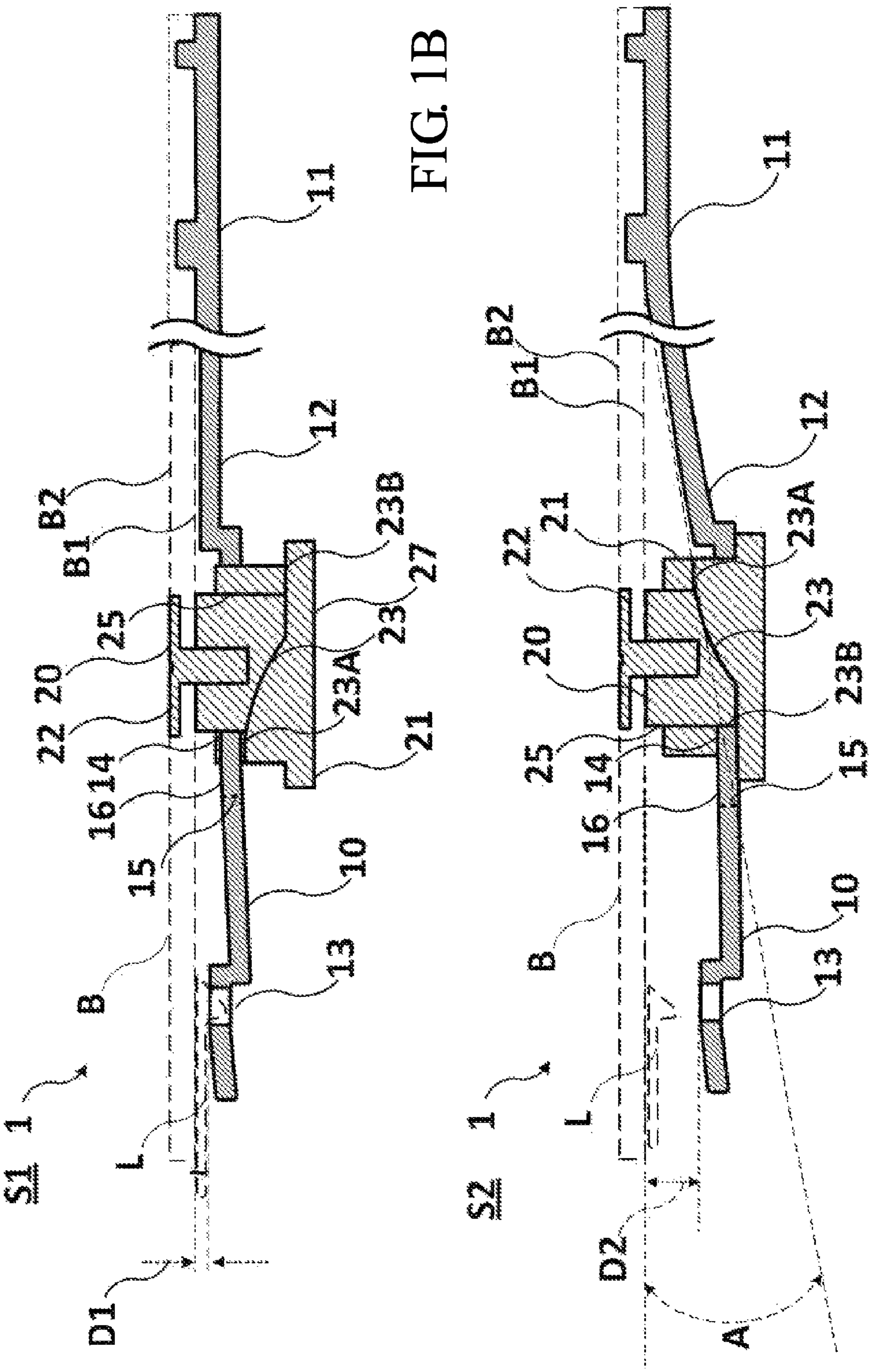
FIG. 1B is a partially cross-sectional front view of the lock in a close status in accordance with an embodiment of the present invention.
FIG. 1C is a partially cross-sectional back view of the lock in a far status in accordance with an embodiment of the present invention.

Now, the lock of the present invention will be described. Referring to FIG. 1A through FIG. 1C together, FIG. 1A is an assembly diagram of a lock in accordance with an embodiment of the present invention, FIG. 1B is a partially cross-sectional front view of the lock in a close status S1 in accordance with an embodiment of the present invention, and FIG. 1C is a partially cross-sectional back view of the lock in a far status S2 in accordance with an embodiment of the present invention. Additionally, FIG. 1C has been turned over horizontally in order to distinguish FIG. 1B and FIG. 1C from each other. As can be seen, the lock 1 of the present invention is disposed on a base B to lock the base B to an external latching element L so that a relative position of the base B is maintained. The aforesaid base B generally refers to any object or a surface thereof on which the lock 1 of the present invention can be disposed. In this embodiment, the base B is a cover plate of a computer housing, but it is not limited thereto. The term "base B" may also refer to an electronic device, a door sheet, or any other object or a surface thereof that conforms to the aforesaid definition. The base B has an inner surface B1 and an outer surface B2. The inner surface B1 is defined as a surface of the base B that faces a lock plate 10, and the outer surface B2 is defined as the other surface of the base B that is opposite to the inner surface. Further, as can be known from the figures, the lock 1 of the present invention generally comprises the lock plate 10 and a motion module 20. Taking FIG. 1A and FIG. 1B as an example, in the present invention, the lock plate 10 is sandwiched between the motion module 20 and the base B and, through axial rotation of the motion module 20, the lock plate 10 is driven to abut against a surface of the motion module 20 so that the lock plate 10 is elastically deformed correspondingly in compliance with thickness variations of the surface of the motion module 20. The lock 1 of the present invention has a close status S1 and a far status S2 depending on different relative positions of the lock plate 10 with respect to the base B. Simply speaking, the lock plate 10 is closer to the base B when the lock 1 is in the close status S1, and is farther from the base B when the lock 1 is in the far status S2. Thereby, the lock 1 of the present invention allows for locking and unlocking.

Figure 2:
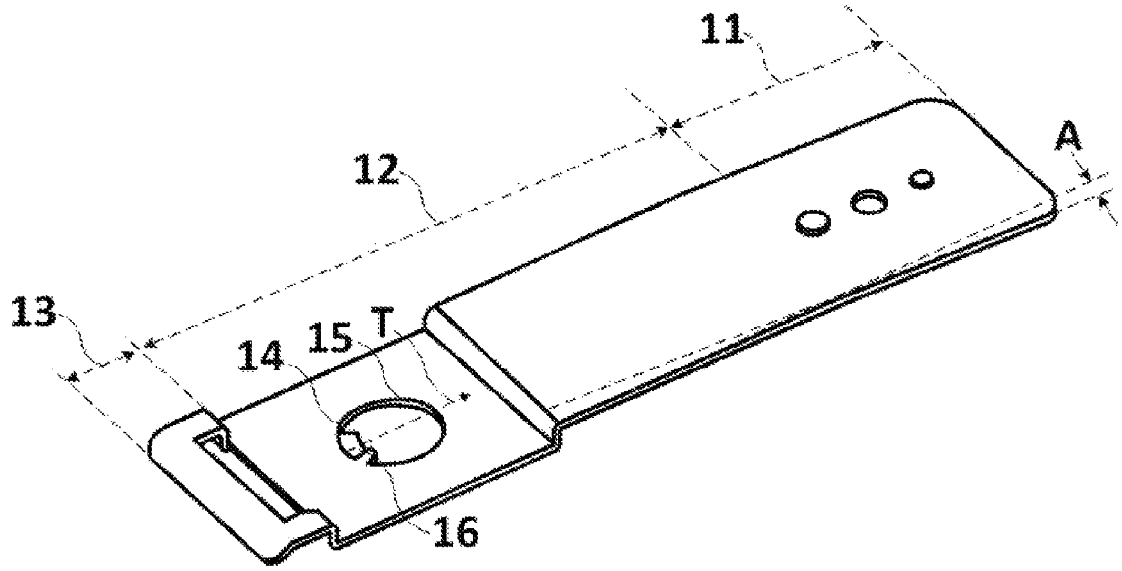
FIG. 2 is a schematic perspective view of a lock plate in accordance with an embodiment of the present invention.

After having generally described the operation mode of the present invention, structures of the lock plate 10 and the motion module 20 will be described respectively now. Referring to FIG. 2, there is shown a schematic perspective view of a lock plate of a lock in accordance with an embodiment of the present invention. The lock plate 10 refers to an element of the lock 1 that is used to mate with or abut against an external latching element L so that the base B and the lock 1 can be locked to each other. Furthermore, the lock plate 10 of the present invention generally has a fixed portion 11, a movable portion 12 and a lock opening 13.

The fixed portion 11 is disposed at an end of the lock plate 10 to fix the lock plate 10 to the surface of the base B. Taking FIG. 2 as an example, the fixed portion 11 is disposed on the lock plate 10 and comprises a large protrusion, a recess and a small protrusion so that the fixed portion 11 can be embedded into a corresponding structure of the base B. It shall be noted that, the large protrusion, the recess and the small protrusion illustrated herein are only provided as an example and are used to prevent wrong assembly by the user. However, the fixed portion 11 of the present invention is not limited to what described above, and any part or structure that is located on the surface of the lock plate 10 and used to connect the lock plate 10 to the surface of the base B can be considered as the fixed portion 11 of the lock plate 10. Furthermore, the means for connection between the fixed portion 11 and the base B is not limited to the protrusions and the recess disclosed above, and the fixed portion 11 and the base B may also be fixed to each other through adhesion, soldering, snap-fitting and so on.

The movable portion 12 of the lock plate 10 is adjacent to the fixed portion 11 of the lock plate 10, and extends outwards from the fixed portion 11. The movable portion 12 can be elastically deformed under the action of a force to adjust a vertical position of the locking opening 13. Furthermore, as depicted, an angle A is included between an extending direction of the movable portion 12 and a surface on which the fixed portion 11 is disposed. Taking the design of FIG. 2 as an example, the angle is approximately 6°, but it is not merely limited thereto. Rather, the angle may be changed or adjusted correspondingly depending on such factors as the size of the lock plate 10, the position of the fixed portion 11 and the shape of the motion module 20, and is preferably smaller than 20°. On the other hand, the surface of the movable portion 12 is formed with a through-hole portion 14 which has a sidewall 15, and the through-hole portion 14 is used for inserting the motion module 20 therethrough. The sidewall 15 further has a protrusion for use as an abutting portion 16. The abutting portion 16 extends from the sidewall 15 in a normal direction T of the sidewall 15. The abutting portion 16 is used to abut against the curved surface 23 of the lock 1 so as to adjust a relative distance between the movable portion 12 of the lock plate 10 and the base B according to the shape of the curved surface 23.

The lock opening 13 extends outwards from the movable portion 12, and is used to interlock with or abut with an external latching element L for purpose of locking the base B.

Generally speaking, the fixed portion 11 of the lock plate 10 is fixed to the base, and the lock opening 13 can be elastically deformed correspondingly in compliance with the varying height of the movable portion 12 so that the lock 1 is switched between a locking status and an unlocking status. Incidentally, the fixed portion 11, the movable portion 12, the through-hole portion 14 and the abutting portion 16 may be (but not limited to) integrally formed with the lock plate 10 (ONE PIECE FORMED).

Figure 3:
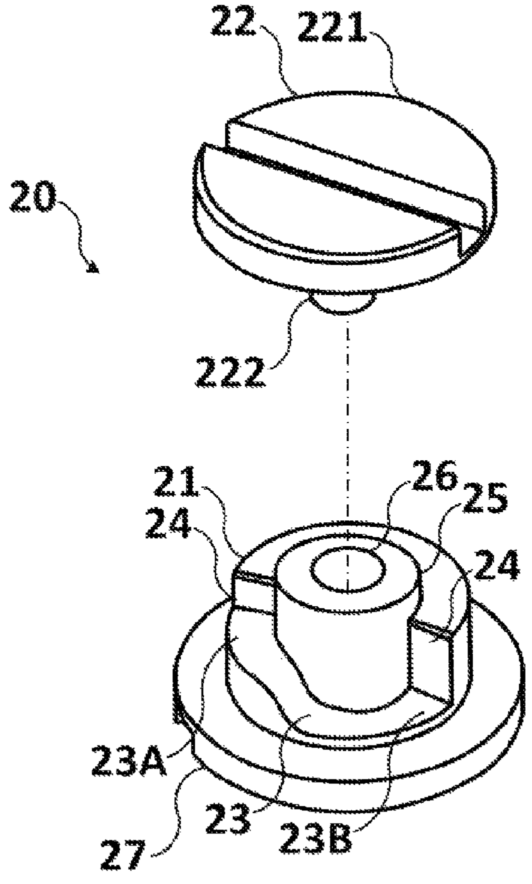
FIG. 3 is a schematic perspective view of a motion module in accordance with an embodiment of the present invention.

Referring next to FIG. 3, there is shown a schematic perspective view of the motion module 20 of the lock 1 in accordance with an embodiment of the present invention. In the present invention, the motion module 20 generally refers to any object capable of controlling a vertical distance between the lock plate 10 and the base B so that the lock 1 can be switched between the locking status and the unlocking status by controlling the position of the lock plate 10, or a combination of such objects. For example, in the design depicted in FIG. 3, the motion module 20 has a main body 21 and an interfacing part 22. The motion module 20 is disposed on the surface of the lock plate 10 and is adapted to apply a force to the lock plate 10 in a direction towards the base B. The motion module 20 has a curved surface 23 facing the lock plate 10, and the curved surface 23 comprises a first surface 23A and a second surface 23B. As can be seen, the first surface 23A and the second surface 23B are disposed at two ends of the curved surface 23 respectively and have a different height or thickness from each other. Additionally, the motion module 20 has two blocking surfaces 24, which are disposed on the first surface 23A and the second surface 23B respectively and extend outwards in a normal direction from the first surface 23A and the second surface 23B respectively to limit a rotation angle of the abutting portion 16. Besides, the motion module 20 has an extending portion 25, which extends vertically towards the base B and is formed with a hollow hole portion 26 for another element to be inserted therein. Meanwhile, the motion module 20 further comprises an interfacing part 22 corresponding to the hollow hole portion 26. The interfacing part 22 has a head portion 221 and a tail portion 222. The tail portion 222 is fixed to an end of the extending portion 25 and extends through the hole of the base B to be pivotally connected with the base B, and the head portion 221 abuts against the outer surface of the base B. To achieve the aforesaid effect, the hole of the base B must have a horizontal cross-section area smaller than that of the head portion 221 and the extending portion 25. Meanwhile, the tail portion 222 is connected into the hollow hole portion 26 through a conventional means so as to move along with the motion module 20. For example, as shown in this figure, the hollow hole portion 26 and the interfacing portion are fixed with respect to each other by an adhesive or a thread structure. Furthermore, the outer surface of the head portion 221 is formed with a recess so that an unlocking tool can be inserted therein to rotate the interfacing part 22. However, the present invention is not limited to the form of a recess, and the recess may also be replaced by a manually operated screw or other tool-free designs depending on the design requirements. Additionally, the reference plane of the aforesaid horizontal cross-sectional area is parallel to the base B.

Next, how the lock of the present invention is used and relationships among individual elements will be further described. Referring back to FIG. 1B and FIG. 1C, the motion module 20 is disposed on the other surface of the lock plate 10 opposite to the base B and is connected to the base B via an extending portion 25 that extends through the base B. After being fixed to the base B, the motion module 20 can only rotate axially and the position thereof or the maximum distance between the motion module 20 and the base B becomes invariable. Meanwhile, the abutting portion 16 of the lock plate 10 will abut against any position of the curved surface 23 of the motion module 20.

Furthermore, the lock 1 has a close status S1 and a far status S2 in use. When the lock 1 is in the close status S1, the abutting portion 16 of the lock plate 10 abuts against the first surface 23A and has a first distance D1 from the base B; and when the lock 1 is in the far status S2, the abutting portion 16 of the locking plate 10 abuts against the second surface 23B and has a second distance D2 from the base B. It shall be appreciated that, switching between the first surface 23A and the second surface 23B of the motion module 20 has no influence on the position of the motion module 20 relative to the base B. It shall be emphasized again that, the motion module 20 can only rotate axially with respect to the base B but cannot perform other axial movements, so the distance between a back surface 27 of the motion module 20 and the base is invariable. Incidentally, the first distance D1 and the second distance D2 are defined as respective minimum vertical distances between the abutting portion 16 of the lock plate 10 and the base B. Simply speaking, the close status S1 refers to a status in which the lock plate 10 is closer to the base B, while the far status S2 refers to a status in which the lock plate 10 is farther from the base B.

Referring to FIG. 1A again, as can be seen, the motion module 20 has a back surface 27, which is defined as a surface of the motion module 20 opposite to the curved surface 23. When the lock 1 is disposed in the close status S1 and the far status S2, the vertical distance between the back surface 27 and the base B remains unchanged and is not affected by variations of the distance between the lock plate 10 and the base B.

More specifically, when the first surface 23A at a higher level abuts against the abutting portion 16 of the lock plate 10, the lock plate 10 is pressed to be elastically deformed towards the base B to move closer to the base B, as shown in FIG. 1B. On the other hand, when the second surface 23B at a lower level abuts against the abutting portion 16 of the lock plate 10, the lock plate 10 is elastically deformed, with the fixed portion 11 being as a fulcrum, in a direction opposite to the base B to move away from the base B, as shown in FIG. 1C. Through the aforesaid operations and through use of an external latching element L, the lock 1 of the present invention can be switched between the locking status and the unlocking status. It shall be appreciated that, switching between the first surface 23A and the second surface 23B of the motion module 20 is accomplished through the horizontal axial rotation of the motion module 20 itself, and the vertical distance between the back surface 27 of the motion module 20 and the base B is not affected by variations of the distance between the lock plate 10 and the base B.

Figure 4A:
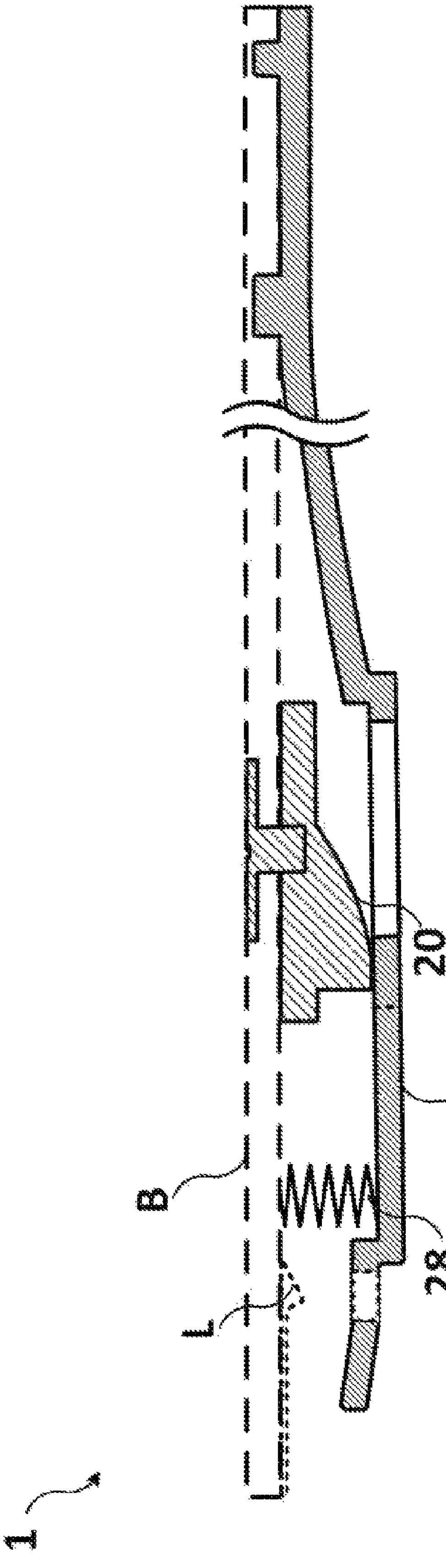
FIG. 4A is a partially cross-sectional front view of a lock in a close status in accordance with another embodiment of the present invention.
Figure 4B:
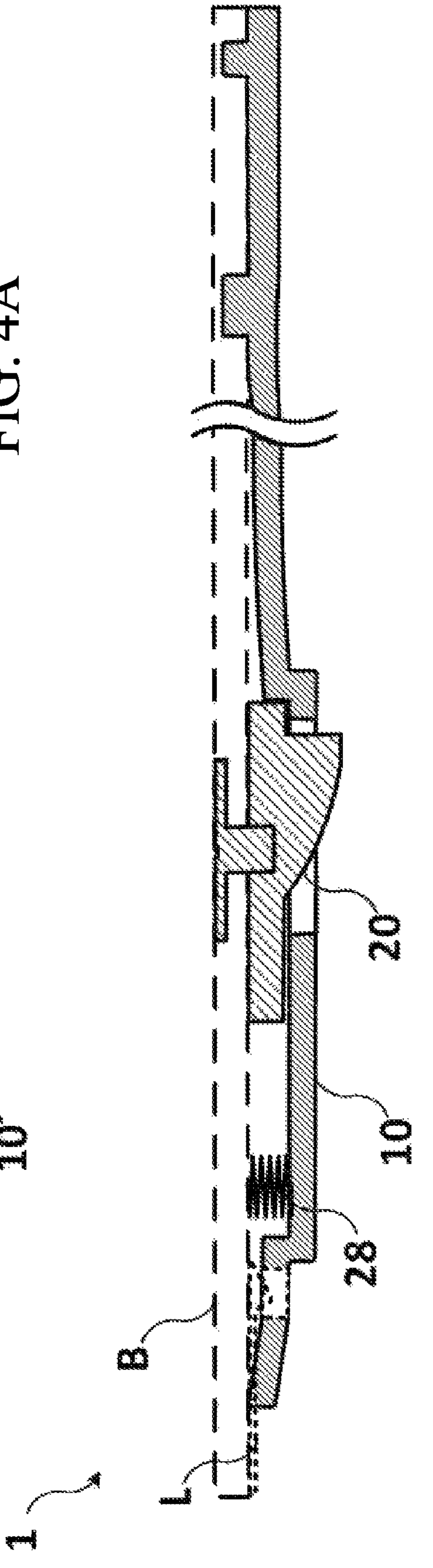
FIG. 4B is a partially cross-sectional back view of the lock in a close status in accordance with another embodiment of the present invention.

It shall also be emphasized that, any module that has a curved surface 23 for the abutting portion 16 to abut against and that can utilize the curved surface 23 to adjust the relative vertical position between the lock plate 10 and the base B can be considered as the motion module 20 of the present invention. For example, besides the design depicted in FIG. 1A, the motion module 20 may also be disposed between the lock plate 10 and the base B with the curved surface 23 thereof facing the lock plate 20 to accomplish the aforesaid movements as shown in FIG. 4A and FIG. 4B. In the latter case, the motion module 20 may selectively comprise a reset element 28 (e.g., a spring or a reed) for applying a force to the lock plate 10 in a direction towards or opposite to the base B. However, the motion module 20 is not limited to having the aforesaid reset element 28, but may also be reset by virtue of elasticity of the lock plate 10 itself. Furthermore, because FIG. 4A and FIG. 4B correspond to FIG. 1B and FIG. 1C respectively, reference may be made to the above descriptions for design of individual elements and no further description will be made herein again. This design is different from the design depicted in FIG. 1A in that, the blocking surfaces 24 are omitted, so a user may lock and unlock the lock in a clockwise or counterclockwise direction and the rotation direction of the motion module during the locking and unlocking operations is not limited. Moreover, the lock of the present invention may also be adjusted to operate reversely, i.e., the locking and unlocking operations are accomplished by having motion module move together with the external latching element and sandwiching the lock plate therebetween.

According to the above descriptions, the present invention provides a novel lock that allows the user to easily lock and unlock an object such as a cover plate of a housing effectively in a limited space. As compared to the prior art, the lock of the present invention has a simple structure, a low manufacturing cost and a small volume. Thereby, the long-lasting problem with the prior art is solved.

The detailed descriptions of the preferred embodiments of the present invention are provided to disclose the features and spirits of the present invention more clearly but not to limit the scope of the present invention thereto. Rather, it is intended to cover various modifications and equivalent arrangements into the scope claimed in the present invention. Accordingly, the scope claimed in the present invention shall be interpreted in the broadest sense to cover all possible modifications and equivalent arrangements.

I claim:

1. A lock mounted to a base, the base having an inner surface and an outer surface, the lock comprising:
- a lock plate; and
- a motion module having a curved surface facing the lock plate, the curved surface comprising a first surface and a second surface;
- wherein the lock has a close status and a far status, and the lock plate abuts against the first surface and has a first distance from the base when the lock is in the close status, and abuts against the second surface and has a second distance, which is greater than the first distance, from the base when the lock is in the far status,
- wherein the lock plate comprises:
- a fixed portion fixed to the inner surface of the base;
- a movable portion extending outwards from the fixed portion; and
- a through-hole portion formed in the movable portion and through the lock plate, and the through-hole portion having a sidewall,
- wherein the motion module has an extending portion that extends vertically towards the base and extends through the through-hole portion.

2. The lock of claim 1, wherein the lock plate further comprises:
- an abutting portion extending in an normal direction from the sidewall and abutting against the curved surface of the motion module to adjust a relative distance between the lock plate and the base.

3. The lock of claim 2, wherein the fixed portion, the movable portion, the through-hole portion and the abutting portion are all integrally formed with the lock plate.

4. The lock of claim 2, wherein the motion module further comprises an interfacing part having a head portion and a tail portion, the tail portion is fixed to an end of the extending portion and penetrates through the base to be pivotally connected with the base, and the head portion abuts against the outer surface of the base.

5. The lock of claim 4, wherein both the head portion and the extending portion have a cross-sectional area greater than that of the tail portion.

6. The lock of claim 2, wherein the motion module has two blocking surfaces, and the two blocking surfaces are disposed on the first surface and the second surface respectively and extend in a normal direction from the first surface and the second surface respectively to limit a rotation angle of the abutting portion.

7. The lock of claim 1, wherein the motion module has a back surface facing away from the lock plate, and a vertical distance between the back surface and the base in the close status is the same as that in the far status.

8. A lock applied to a base of an electronic device, the base having an inner surface and an outer surface, the lock comprising:
- a lock plate comprising:
  - a fixed portion; and
  - a movable portion;
- a motion module having a curved surface facing the lock plate, the curved surface comprising a first surface and a second surface; and
- a through-hole portion formed in the movable portion and through the lock plate, and the through-hole portion having a sidewall, wherein the motion module comprises an extending portion that extends vertically towards the base and extends through the through-hole portion.

9. The lock of claim 8, wherein the base is a cover plate of the electronic device, and the fixed portion fixed to the inner surface of the base, and the movable portion extends outwards from the fixed portion.

10. The lock of claim 8, wherein the lock has a close status and a far status, and the lock plate abuts against the first surface and has a first distance from the base when the lock is in the close status, and abuts against the second surface and has a second distance, which is greater than the first distance, from the base when the lock is in the far status.

11. The lock of claim 8, wherein the lock plate further comprises:

an abutting portion extending in an normal direction from the sidewall and abutting against the curved surface of the motion module to adjust a relative distance between the lock plate and the base.

12. The lock of claim 11, wherein the fixed portion, the movable portion, the through-hole portion and the abutting portion are all integrally formed with the lock plate.

13. The lock of claim 11, wherein the motion module further comprises an interfacing part having a head portion and a tail portion, the tail portion is fixed to an end of the extending portion and penetrates through the base to be pivotally connected with the base, and the head portion abuts against the outer surface of the base, and wherein both the head portion and the extending portion have a cross-sectional area greater than that of the tail portion.

14. The lock of claim 11, wherein the motion module comprises two blocking surfaces, and the two blocking surfaces are disposed on the first surface and the second surface respectively and extend in a normal direction from the first surface and the second surface respectively to limit a rotation angle of the abutting portion.

15. The lock of claim 10, wherein the motion module comprises a back surface facing away from the lock plate, and a vertical distance between the back surface and the base in the close status is the same as that in the far status.

16. A lock applied to a base of a computer housing, the base having an inner surface and an outer surface, the lock comprising:

a lock plate comprising:

a fixed portion fixed to the inner surface of the base;

a movable portion extending outwards from the fixed portion;

a through-hole portion formed in the movable portion and through the lock plate, and the through-hole portion having a sidewall; and an abutting portion extending in an normal direction from the sidewall and abutting against the curved surface of the motion module to adjust a relative distance between the lock plate and the base; and a motion module having a curved surface facing the lock plate, the curved surface comprising a first surface and a second surface, the motion module comprising:

an extending portion extending vertically towards the base and extending through the through-hole portion;

an interfacing part having a head portion and a tail portion, the tail portion is fixed to an end of the extending portion and penetrates through the base to be pivotally connected with the base, and the head portion abuts against the outer surface of the base, wherein both the head portion and the extending portion have a cross-sectional area greater than that of the tail portion;

two blocking surfaces disposed on the first surface and the second surface respectively and extending in a normal direction from the first surface and the second surface respectively to limit a rotation angle of the abutting portion; and a back surface facing away from the lock plate.

17. The lock of claim 16, wherein the base is a cover plate of the computer housing, and the fixed portion, the movable portion, the through-hole portion and the abutting portion are all integrally formed with the lock plate.

18. The lock of claim 16, wherein the lock has a close status and a far status, and the lock plate abuts against the first surface and has a first distance from the base when the lock is in the close status, and abuts against the second surface and has a second distance, which is greater than the first distance, from the base when the lock is in the far status, and wherein a vertical distance between the back surface and the base in the close status is the same as that in the far status.

* * * * *